United States Patent
Russell

(10) Patent No.: US 7,443,745 B2
(45) Date of Patent: Oct. 28, 2008

(54) BYTE WRITEABLE MEMORY WITH BIT-COLUMN VOLTAGE SELECTION AND COLUMN REDUNDANCY

(75) Inventor: Andrew C. Russell, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 34 days.

(21) Appl. No.: 11/612,626

(22) Filed: Dec. 19, 2006

(65) Prior Publication Data
US 2008/0144409 A1    Jun. 19, 2008

(51) Int. Cl.
*G11C 29/00* (2006.01)
(52) U.S. Cl. .............................. 365/200; 365/189.011; 365/189.14; 365/189.04
(58) Field of Classification Search ................. 365/200, 365/189.011, 189.14, 189.04
See application file for complete search history.

(56) References Cited

U.S. PATENT DOCUMENTS

| | | | |
|---|---|---|---|
| 6,480,415 B2 * | 11/2002 | Makuta et al. | 365/185.09 |
| 6,556,479 B2 * | 4/2003 | Makuta et al. | 365/185.09 |
| 2005/0024981 A1 | 2/2005 | Bateman et al. | |
| 2006/0034137 A1 * | 2/2006 | Zanardi | 365/200 |

OTHER PUBLICATIONS

K. Zhang, et al., "A 3-Ghz 70Mb SRAM in 65nm CMOS Technology with Integrated Column-Based Dynamic Power Supply", IEEE International Solid-State Circuits Conference 2005, pp. 474, 475, 611.

* cited by examiner

*Primary Examiner*—Thong Q Le
(74) *Attorney, Agent, or Firm*—Ranjeev Singh

(57) ABSTRACT

A method for accessing a memory comprising a first set of bit columns, a second set of bit columns, and a redundant set of bit columns, wherein any one of the redundant set of bit columns can be substituted for one of the first set of bit columns or one of the second set of bit columns and wherein each of the bit columns can receive a read voltage or a write voltage, is provided. The method includes during a write operation to the first set of bit columns, providing the write voltage to one of the redundant set of bit columns, if the one of the redundant set of bit columns has been substituted for one of the first set of bit columns, otherwise providing the read voltage to the redundant set of bit columns.

15 Claims, 3 Drawing Sheets

BYTE WRITEABLE MEMORY WITH BIT-COLUMN VOLTAGE SELECTION AND COLUMN REDUNDANCY

BACKGROUND

1. Field

This disclosure relates generally to memory arrays, and more specifically, to a byte writeable memory with bit-column voltage selection and column redundancy.

2. Related Art

Increasingly, to reduce power consumption, newer generation of integrated circuits are using a lower supply voltage. The lower supply voltage when used to read/write a memory included in the integrated circuit, however, degrades the performance of bitcells of the memory. In particular, the lower supply voltage results in a lower read/write margin for the bitcells. To address this problem, some memories may have voltage boosting circuits, which boost the voltage supply to a bitcell when necessary. For example, during a read operation, the bitcell voltage can be increased relative to the wordline voltage, but during a write operation, the bitcell voltage can be decreased relative to the wordline voltage.

This selective voltage application scheme, however, requires additional logic for proper functioning of memories having redundant column bits with multiple bytes on the same wordline. In particular, during a write operation, the redundant column bits may not be written. Thus, there is a need for a method for accessing a byte writeable memory with bit-column voltage selection so that the redundant columns are provided an appropriate voltage.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
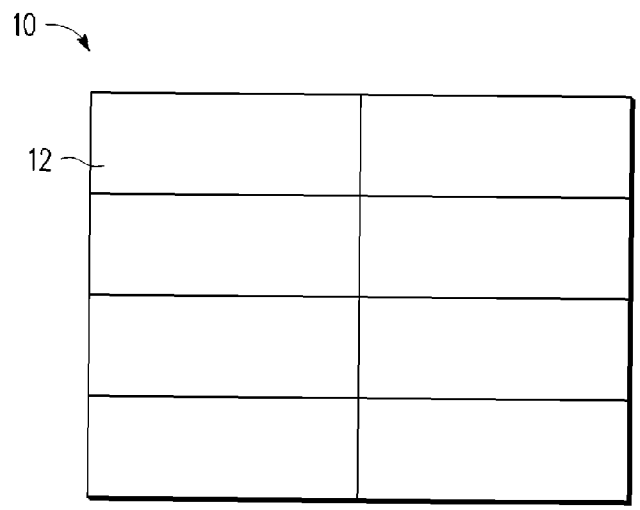
FIG. 1 shows an exemplary portion of a memory.

In one aspect, a method for accessing a memory comprising a first set of bit columns, a second set of bit columns, and a redundant set of bit columns, wherein any one of the redundant set of bit columns can be substituted for one of the first set of bit columns or one of the second set of bit columns and wherein each of the bit columns can receive a read voltage or a write voltage, is provided. The method includes during a write operation to the first set of bit columns, providing the write voltage to one of the redundant set of bit columns, if the one of the redundant set of bit columns has been substituted for one of the first set of bit columns, otherwise providing the read voltage to the redundant set of bit columns.

In another aspect, a method for accessing a memory comprising a first set of bit columns, a second set of bit columns, and a redundant set of bit columns, wherein any one of the redundant set of bit columns can be substituted for one of the first set of bit columns or one of the second set of bit columns and wherein each of the bit columns can receive a read voltage or a write voltage, is provided. The method includes during a write operation to the first set of bit columns, decoupling at least one of a bitcell in the one of the redundant set of bit columns from the write voltage, if the one of the redundant set of bit columns has been substituted for one of the first set of bit columns, otherwise providing the read voltage to the redundant set of bit columns.

In yet another aspect, a memory comprising a first set of bit columns, a second set of bit columns, and a redundant set of bit columns, wherein any one of the redundant set of bit columns can be substituted for one of the first set of bit columns or one of the second set of bit columns and wherein each of the bit columns can receive a read voltage or a write voltage, is provided. The memory comprises a component configured for during a write operation to the first set of bit columns, providing the write voltage to one of the redundant set of bit columns if the one of the redundant set of bit columns has been substituted for one of the first set of bit columns and providing the read voltage to a remaining redundant set of bit columns. The component is further configured for during a read operation of the first set of bit columns, providing the read voltage to the first set of bit columns, the second set of bit columns, and the redundant set of bit columns.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Brackets are used herein to indicate the conductors of a bus or the bit locations of a value. For example, "COLSEL (0:7)" indicates the eight bits of a column select signal.

FIG. 1 shows a memory block 10 including eight sub-arrays, such as sub-array 12. Memory block 10 may be a portion of a larger memory and may be coupled to a CPU (not shown). For example, 64 instances of memory block 10 may be used to implement a 1 megabyte cache. By way of example, the bitcells may be static random access memory cells. Memory and CPU may be supplied a voltage via a $V_{DD}$ voltage terminal. The $V_{DD}$ voltage terminal may be an external pin or connection for an integrated circuit on which memory block 10 is located.

Figure 2:
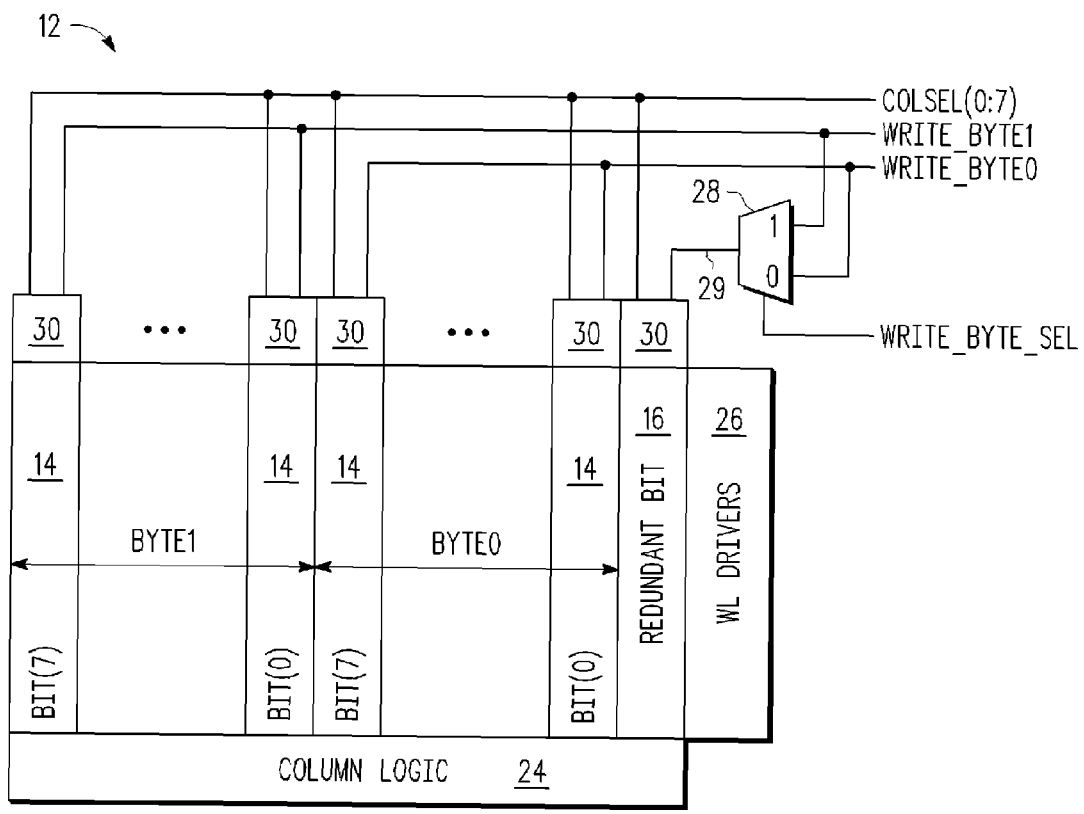
FIG. 2 shows an exemplary sub-array of the exemplary portion of the memory of FIG. 1.

FIG. 2 shows an exemplary sub-array 12 of the exemplary portion of the memory of FIG. 1. Sub-array 12 may comprise bit columns 14 and a set of redundant bit columns 16. Bit columns 14 and redundant bit columns 16 represent a group of eight bit columns where each bit of data, such as BIT(0), is associated with a group of eight bit columns. When reading or writing a bit of data, the COLSEL(0:7) signals are used to select one of the eight bit columns. Each bit column may include bitcells formed at the intersection of bit columns 14 and rows formed as part of sub-array 12. For illustrative purposes, FIG. 2 shows only two sets of bit columns 14, one for storing BYTE0 and another for storing BYTE1. One skilled in the art would appreciate that sub-array 12 may comprise any number of bit columns and any number of sets of bit columns. Moreover, although redundant set of bit columns 16 is shown adjacent to only bit columns corresponding to BYTE0, redundant set of bit columns may be provided in other locations, as well. Redundant set of bit columns 16 is used to repair the memory when a bit column of the set of bit columns 14 is defective. For example, if BIT(7) of BYTE1 is found to have a defective bit column, then a redundant bit would be used to replace BIT(7) of BYTE1.

Referring still to FIG. 2, each bit column may be coupled to a bit column voltage selection logic block, which may be used to couple a bit column to read voltage or write voltage. Block 30 includes eight bit column voltage selection logic blocks corresponding to the eight bit columns of bit columns 14 or redundant bit columns 16. Column logic 24 and word line WL drivers 26 are coupled to bit columns 14 and redundant bit columns 16 to enable read/write operations to sub-array 12. Sub-array 12 may be byte writeable, in that a processor coupled to sub-array 12 may be able to read or write byte-sized data to a row of sub-array 12 without having to write the entire row. Although FIG. 2 shows a byte writeable sub-array, sub-array 12 may be configured to store larger or smaller size of data. For example, sub-array 12 may consist of 4 bytes in which case there would be 4 WRITE_BYTE signals coupled to multiplexer 28. Additionally, other types of write granularity may be implemented such as word write-ability. The COLSEL(0:7) signals are coupled to each block 30 so that one COLSEL signal, such as COLSEL(0), is coupled to one bit column voltage selection logic block. WRITE_BYTE 0 and WRITE_BYTE 1 signals may be used to select which byte is being written. Each WRITE_BYTE signal is coupled to each bit column voltage selection logic block of each bit column corresponding to a byte. WRITE_BYTE 0 and WRITE_BYTE 1 signals may be coupled to a multiplexer 28, which may be controlled by WRITE_BYTE_SEL signal. The WRITE_BYTE_SEL signal selects the appropriate WRITE_BYTE signal to couple to the redundant bit depending on which byte the redundant bit belongs to. For example, if the redundant bit is used to replace a defective column in BYTE1, then the WRITE_BYTE1 signal will be used to control the voltage during reads and writes to the redundant bit. The output of multiplexer 28 may be WRITE_REDUNDANT_BIT 29 signal, which is coupled to each of the eight bit column voltage selection logic blocks of block 30 and, which, when asserted, signals that the redundant bit is being written.

During a write operation to a first set of bit columns (e.g., bit columns corresponding to BYTE1), write voltage is provided to one of the redundant set of bit columns, if the one of the redundant set of bit columns has been substituted for one of the first set of bit columns. This is because WRITE_REDUNDANT_BIT signal as well as one of the COLSEL(0:7) signals will be asserted. Otherwise the read voltage is provided to the redundant set of bit columns. This way when the byte that the redundant bit belongs to is being written, the redundant bit column being written gets a decreased voltage. This improves the write margin, whereas other unselected bit columns undergoing dummy read get an increased voltage, which in turn improves the read margin. In another embodiment, during a write operation, at least one bitcell corresponding to redundant bit columns 16 may also be decoupled from the write voltage. The means for decoupling the bitcell from the voltage supply during a write operation may be implemented as part of block 30 or they may be implemented as part of the bitcell itself. During a write operation, when the redundant bit does not belong to the byte being written, the bit columns corresponding to the redundant bit undergo dummy read and receive an increased voltage to improve the read margin at low voltage. During read operations, all bit columns corresponding to redundant bits receive the increased voltage since the WRITE_REDUNDANT_BIT signal will again be de-asserted. Control of the redundant bit column's voltage is achieved using COLSEL(0:7) signals and WRITE_REDUNDANT_BIT 29 signal.

Figure 3:
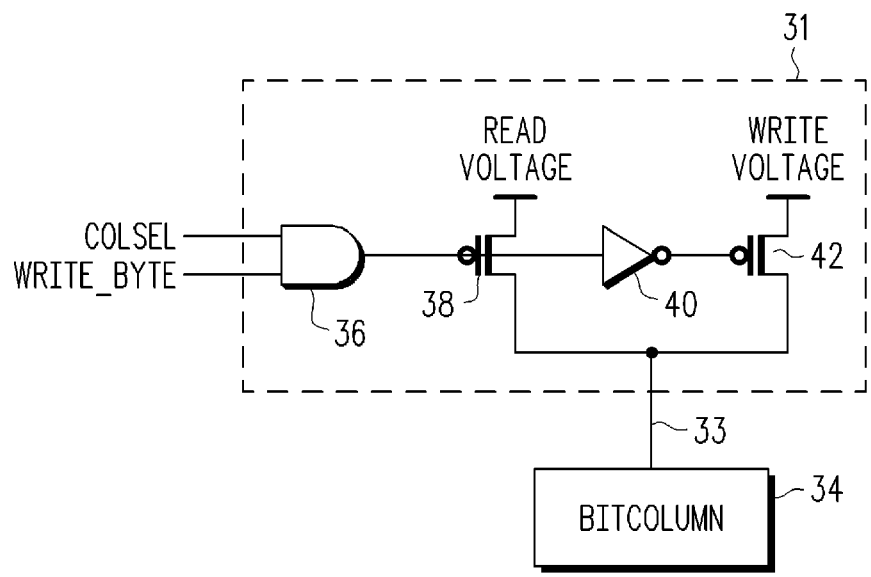
FIG. 3 shows an exemplary bit column voltage selection logic block for the exemplary sub-array of FIG. 2.

FIG. 3 shows an exemplary bit column voltage selection logic block 31 for the exemplary sub-array of FIG. 2. Bit column voltage selection logic block 31 includes an AND gate 36, a p-MOS transistor 38, an inverter 40, and another p-MOS transistor 42. AND gate 36 is used to perform logic AND operation on columns select (COLSEL) and WRITE_BYTE signals. In case the bit column voltage selection logic block is coupled to a redundant bit column, then the WRITE_BYTE signal would be replaced with the WRITE_REDUNDANT_BIT 29 signal of FIG. 2. A control electrode of transistor 38 is coupled to an output of AND gate 36. A source of transistor 38 is coupled to read voltage. Read and write voltages may be generated on the integrated circuit on which memory block 10 is located or alternatively, these voltages may be generated externally. An inverted output of AND gate 36 is coupled to a control electrode of transistor 42. A source of transistor 42 is coupled to write voltage. The drains of transistors 38 and 42 are tied and are coupled to bit column 34 via node 33. In operation, if both column select and WRITE_BYTE are logic high then write voltage is coupled to bit column 34, otherwise read voltage is coupled to bit column 34. One skilled in the art will appreciate that FIG. 3 is an exemplary implementation of bit column voltage selection logic block and the functionality corresponding to this logic block may be achieved using other components and arrangements.

Figure 4:
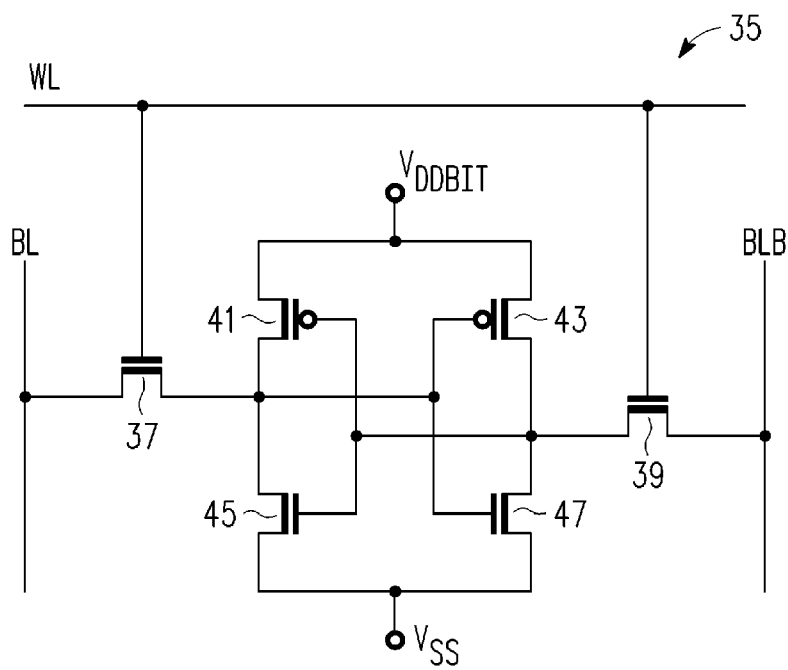
FIG. 4 shows an exemplary bitcell, which may be implemented as part of memory of FIG. 1.

FIG. 4 shows an exemplary bitcell 35, which may be implemented as part of bit column 34. Exemplary bitcell 35 may be implemented as a six transistor cell. By way of example, as shown in FIG. 4 bitcell 35 may include a pass transistor 37 with one of its current terminals coupled to the bit line BL and its control terminal coupled to the word line WL. Bitcell 35 may farther include another pass transistor 39 with one of its current terminals coupled to the bit line BLB and its control terminal coupled to the word line WL. Bitcell 35 may further include a pull up transistor 41 with one of its current terminals coupled to the $V_{DDBIT}$ voltage terminal. The $V_{DDBIT}$ voltage terminal of each bitcell 35 of bit column 34 may be coupled to node 33 of FIG. 3. In another embodiment, the $V_{ss}$ terminal of each bitcell 35 of bit column 34 may be coupled to node 33. Bitcell 35 may further include another pull up transistor 43 with one of its current terminals coupled to the $V_{DDBIT}$ voltage terminal. Bitcell 35 may further include a pull down transistor 45 with one of its current terminals coupled to the ground voltage $V_{ss}$ terminal. Bitcell 35 may further include another pull down transistor 47 with one of its current terminals coupled to the voltage $V_{ss}$ terminal. Although FIG. 4 shows bitcell 35 implemented using six transistors, bitcell 35 may be implemented using more transistors, for example, using eight transistors. In other embodiments, bitcell 35 may include at least one additional transistor coupled between the $V_{DDBIT}$ or $V_{ss}$ voltage terminal and node 33.

Figure 5:
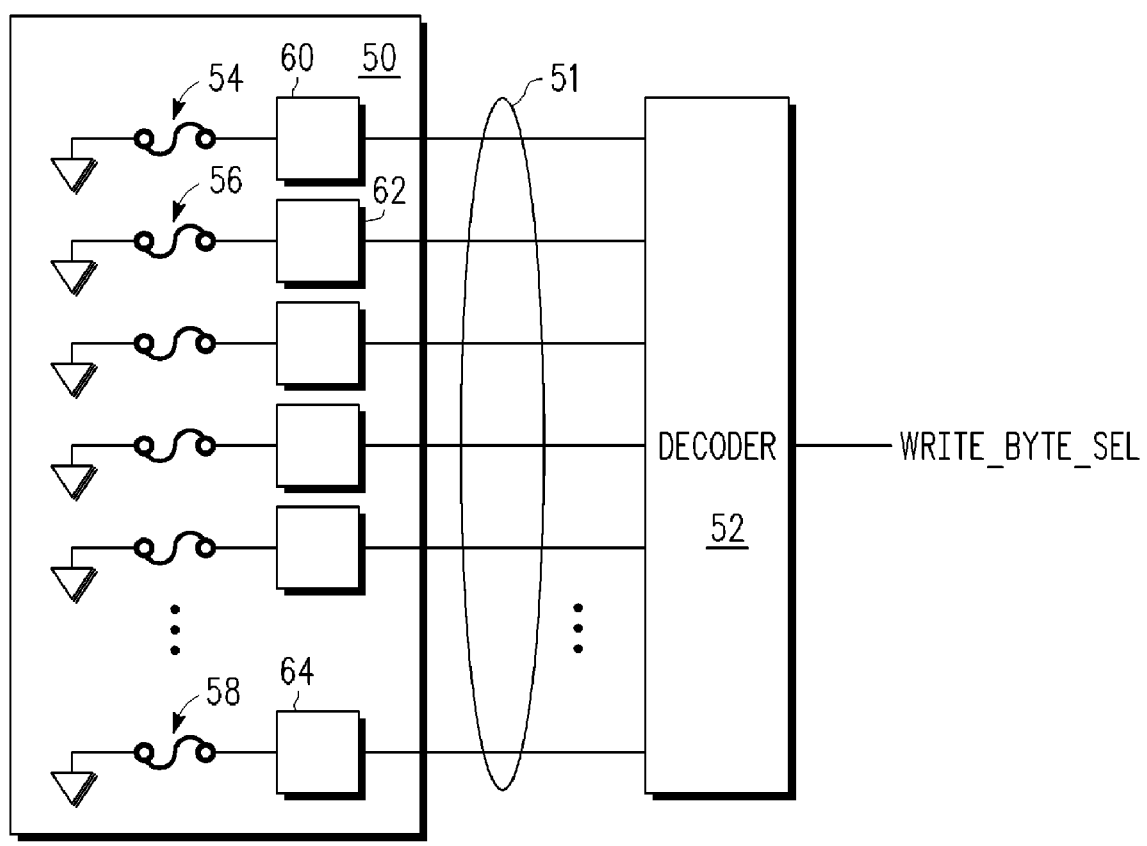
FIG. 5 shows an exemplary fuse block and decoder for generating a control signal for the sub-array of FIG. 2.

FIG. 5 shows an exemplary block diagram for generating a control signal for the sub-array of FIG. 2. A fuse block 50 may include fuses 54, 56, and 58 for example, and fuse logic 60, 62, and 64, for example. The fuse logic is used to sense whether a fuse has been blown or not and to latch the fuse value after sensing. In this embodiment, an un-blown fuse would represent logic zero and a blown fuse would represent logic one. After manufacturing, memories are tested to determine rows and columns with defective bitcells. If a memory has been built with redundant rows and columns, fuses, such as the fuses of fuse block 50, will be blown to disable the defective column, for example, and enable the use of a redundant column in its place. There may be one fuse block per sub-array or a group of sub-arrays may share a fuse block to reduce the total number of fuses required to implement redundancy in a memory. Decoder 52 generates a WRITE_BYTE_SEL signal by decoding the latched fuse values 51, which designate a defective column. There may be one WRITE_BYTE_SEL signal generated for each sub-array or a group of sub-arrays may share the same WRITE_BYTE_SEL signal if they share the same set of fuses. Decoder 52 may generate more than one signal. If, for example, multiplexer 28 selects among 4 WRITE_BYTE signals, then at least two WRITE_BYTE_SEL signals would be required.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for accessing a memory comprising a first set of bit columns, a second set of bit columns, and a redundant set of bit columns, wherein any one of the redundant set of bit columns can be substituted for one of the first set of bit columns or one of the second set of bit columns and wherein each of the bit columns can receive a read voltage or a write voltage, the method comprising:

during a write operation to the first set of bit columns, providing the write voltage to one of the redundant set of bit columns, if the one of the redundant set of bit columns has been substituted for one of the first set of bit columns, otherwise providing the read voltage to the redundant set of bit columns, wherein the write voltage is lower than the read voltage, such that during the write operation if the one of the redundant set of bit columns has been substituted for one of the first set of bit columns, the substituted bit column receives a lower voltage than otherwise.

2. The method of claim 1 further comprising providing the read voltage to a remaining redundant set of bit columns if the one of the redundant set of bit columns has been substituted for one of the first set of bit columns.

3. The method of claim 1 further comprising, during a read operation, providing the read voltage to the first set of bit columns, the second set of bit columns, and the redundant set of bit columns.

4. The method of claim 1, wherein providing the write voltage to the one of the redundant set of bit columns comprises decoupling at least one bitcell of the one of the redundant set of bit columns from the write voltage.

5. The method of claim 1, wherein the memory is a byte writeable memory such that in response to an assertion of one of a plurality of write byte enable signals, a byte size data can be written to the memory.

6. The method of claim 1, wherein the redundant set of bit columns is used to repair the memory when a bit column of the memory is defective and wherein the second set of bit columns is adjacent to the redundant set of bit columns.

7. The method of claim 5 further comprising determining to which byte a particular redundant bit belongs to by deriving a write byte select signal from a decoder coupled to a fuse block.

8. A method for accessing a memory comprising a first set of bit columns, a second set of bit columns, and a redundant set of bit columns, wherein any one of the redundant set of bit columns can be substituted for one of the first set of bit columns or one of the second set of bit columns and wherein each of the bit columns can receive a read voltage or a write voltage, the method comprising:

during a write operation to the first set of bit columns, decoupling at least one of a bitcell in the one of the redundant set of bit columns from the write voltage, if the one of the redundant set of bit columns has been substituted for one of the first set of bit columns, otherwise providing the read voltage to the redundant set of bit columns, wherein the memory is a byte writeable memory such that in response to an assertion of one of a plurality of write byte enable signals, a byte size data can be written to the memory; and determining to which byte a particular redundant bit belongs to by deriving a write byte select signal from a decoder coupled to a fuse block.

9. The method of claim 8 further comprising providing the read voltage to a remaining redundant set of bit columns.

10. The method of claim 8 further comprising, during a read operation, providing the read voltage to the first set of bit columns, the second set of bit columns, and the redundant set of bit columns.

11. The method of claim 8, wherein the redundant set of bit columns is used to repair the memory when a bit column of the memory is defective and wherein the second set of bit columns is adjacent to the redundant set of bit columns.

12. The method of claim 8, wherein the write voltage is lower than the read voltage, such that during the write operation if the one of the redundant set of bit columns has been substituted for one of the first set of bit columns, the substituted bit column receives a lower voltage than otherwise.

13. A memory comprising a first set of bit columns, a second set of bit columns, and a redundant set of bit columns, wherein any one of the redundant set of bit columns can be substituted for one of the first set of bit columns or one of the second set of bit columns and wherein each of the bit columns can receive a read voltage or a write voltage, the memory comprising:

a component configured for during a write operation to the first set of bit columns, providing the write voltage to one of the redundant set of bit columns if the one of the redundant set of bit columns has been substituted for one of the first set of bit columns and providing the read voltage to a remaining redundant set of bit columns; and during a read operation of the first set of bit columns, providing the read voltage to the first set of bit columns, the second set of bit columns, and the redundant set of bit columns, wherein the redundant set of bit columns is used to repair the memory when a bit column of the memory is defective and wherein the second set of bit columns is adjacent to the redundant set of bit columns, and wherein the redundant set of bit columns is used to repair the memory by blowing at least one fuse corresponding to the redundant set of bit columns.

14. The memory of claim 13, wherein the component is further configured for decoupling at least one bitcell of the one of the redundant set of bit columns from the write voltage.

15. The memory of claim 13, wherein the memory is a byte writeable memory such that in response to an assertion of one of a plurality of write byte enable signals, a byte size data can be written to the memory.

* * * * *